United States Patent [19]
Tennant et al.

[11] Patent Number: 6,034,407
[45] Date of Patent: Mar. 7, 2000

[54] MULTI-SPECTRAL PLANAR PHOTODIODE INFRARED RADIATION DETECTOR PIXELS

[75] Inventors: William E. Tennant; William V. McLevige, both of Thousand Oaks, Calif.

[73] Assignee: Boeing North American, Inc., Seal Beach, Calif.

[21] Appl. No.: 09/127,437

[22] Filed: Jul. 31, 1998

[51] Int. Cl.[7] .............................. H01L 31/00; H01L 31/06
[52] U.S. Cl. ............................................. 257/440; 257/461
[58] Field of Search ....................................... 257/440, 461

[56] References Cited

U.S. PATENT DOCUMENTS

| | | |
|---|---|---|
| 4,377,723 | 3/1983 | Dalal . |
| 5,009,719 | 4/1991 | Yoshida . |
| 5,149,956 | 9/1992 | Norton . |
| 5,373,182 | 12/1994 | Norton . |
| 5,391,896 | 2/1995 | Wanlass . |
| 5,825,071 | 10/1998 | Takakura . |

*Primary Examiner*—Stephen D. Meier
*Attorney, Agent, or Firm*—Stout, Uxa, Buyan & Mullins, LLP; Donald E. Stout

[57] ABSTRACT

Multi-spectral planar photodiode pixels are provided in accordance with the present invention for simultaneously detecting multi-colors of infrared radiation. Each multispectral planar photodiode pixel includes a semiconductor substrate layer, a buffer layer of a first conductivity type material deposited on a semiconductor substrate layer, and a first color layer of the first conductivity type material deposited on the buffer layer. The multispectral planar photodiode pixel further includes a barrier layer of the first conductivity type material deposited on the first color layer, a second color layer of the first conductivity type material deposited on the barrier layer, and a cap layer of the first conductivity type material deposited on the second color layer. A first diode comprising a second conductivity type material is formed in the first color layer, and a second diode comprising a second conductivity type material is formed in the second layer.

19 Claims, 3 Drawing Sheets

MULTI-SPECTRAL PLANAR PHOTODIODE INFRARED RADIATION DETECTOR PIXELS

BACKGROUND OF THE INVENTION

1. Field of the Invention

The present invention relates generally to infrared radiation detectors and, more particularly, to multi-spectral, simultaneous infrared radiation detection devices.

2. Description of Related Art

Various infrared radiation detection devices have existed in the prior art. Single-color infrared radiation detection devices typically can be constructed with relative ease to provide greater performance, design simplicity, and reliability, as compared to multi-color infrared radiation detection devices.

Multi-color or multi-spectral infrared radiation detection devices often offer significant advantages, as compared to single-color infrared radiation detection devices, for example in connection with discriminating targets and implementing surveillance systems. Although multi-color infrared radiation detection devices have existed in the prior art, designs offering simultaneous detection over the full pixel area in at least two spectral bands with adequate pixel count, such as greater than 64 by 64, and adequate resolution, such as less than 75 microns, often require architectures or processes which compromise performance or manufacturability compared to single color detectors. Such compromising architectures may consist of special electronic readout circuits to deal with detectors of different polarity or special detector architectures which require especially difficult processing to delineate detectors. Compromising processes may be ones which require harsh etching of photodiode junction perimeters or growth of epitaxial layers over irregular structured surfaces which may further contain electronically delicate junctions.

Generally, a pixel or picture element, comprises an infrared radiation detector for each color, and readout circuits are connected to the individual infrared radiation detectors of each pixel element. This readout circuit architecture can be fabricated using standard silicon integrated circuit technology available from commercial foundries and may be a part of a larger silicon integrated circuit, other parts of which may be connected to other pixels. The silicon integrated circuit operates as an amplifier and a multiplexer for the signal generated in the detectors of each pixel by infrared radiation. Conventional architectures can carry high performance penalties by forcing the readout circuits' to deal with diodes of both p-on-n and n-on-p polarities. The readout circuits for many conventional detection devices require the subtraction of large currents within a single pixel element, wherein the single pixel element comprises two infrared radiation detector diodes, each of a different color. To preserve high performance this subtraction must be nearly noiseless. In a typical application for these devices these devices, a medium wavelength infrared (MWIR) signal is obtained by subtracting the long wavelength infrared (LWIR) generated photo-current from that generated by both the MWIR and the LWIR fluxes. The magnitudes of these currents are typically 100 to 1 (LWIR to MWIR). Even a few percent cross-talk of LWIR signal in the MWIR band will likely overwhelm the MWIR signal. Additionally, the complex subtraction circuit can rob the small input cell (for processing information from the readout circuit) of needed room for integration capacitors and field effect transistors (FET's) required for significant charge handling capability. Material growth and junction delineation in conventional devices can also compromise efficiencies and performance. A multi-color infrared radiation detection device is needed which address the above problems and, in particular, provides detection sensitivity comparable to that of single-color infrared radiation detectors, simultaneous detection in all bands or colors, broadband sensitivity within each band, low electrical and optical cross talk between pixels and colors, high optical fill factor, compatibility with existing readout circuits (common diode polarity, standard bias requirements, etc.), and minor impact on processing.

SUMMARY OF THE INVENTION

Pixels containing planar photodiodes are provided in accordance with the present invention for simultaneously detecting multiple wavelengths (colors) of infrared radiation. Each multi-spectral planar photodiode detector pixel includes a semiconductor substrate layer, preferably a buffer layer of a first conductivity type material deposited on the semiconductor substrate layer (to minimize substrate interface recombination), and a first color layer of the first conductivity type material deposited on the buffer layer. The multi-spectral planar photodiode detector pixel further includes a barrier layer of the first conductivity type material deposited on the first color layer, a second color layer of the first conductivity type material deposited on the barrier layer, and a cap layer of the first conductivity type material deposited on the second color layer. A first diode comprising a second conductivity type material is formed in the first color layer, and a second diode comprising a second conductivity type material is formed in the second layer. Note that for more than two colors, additional barrier and cap layers may be grown and additional junctions formed on the second color layer instead of the cap in the same manner as the first color layer and cap were formed on the buffer layer. The last layer to be grown will be the longest wavelength and will have a cap layer to improve device performance.

The first color layer, the barrier layer, the second color layer and the cap layer are all formed on the semiconductor substrate in a single growth run. A delineating trench extending into the buffer layer and having a conductor formed therein can be formed around the first and second diodes. The semiconductor substrate may comprise a CdZnTe semiconductor substrate, and the first and second color layers may comprise HgCdTe semiconductor structures having first and second band gaps, respectively. In accordance with the present invention, the first band gap is greater than the second band gap.

A method of fabricating a plurality of semiconductor electromagnetic radiation detectors, in accordance with the present invention, comprises a first step of depositing buffer, first color layer, barrier layer, second color layer, and cap layer of a common conductivity type onto a substrate in a single growth run. A second step consists of etching into the cap, second color, barrier, and (typically) first color layers to thereby form a depression. A pattern of a first dopant is introduced into the depression to thereby form a first planar diode in the first color layer, in a manner wherein the first dopant induces a conductivity type that is opposite to the common conductivity type. The method includes a step of introducing a pattern of a second dopant into the cap and second color layers to thereby induce a second planar diode, wherein the second dopant has a conductivity type that is opposite to the common conductivity type. A band gap of the first color layer material is greater than a band gap of the second color layer material. Subsequent steps of the method of the present invention include a step of forming a first conductor onto the first diode and a step of forming a second conductor onto the second diode. The second diode may utilizes lateral collection for detection of LWIR radiation, and the first diode may use lateral collection for detection of MWIR radiation.

The present invention, together with additional features and advantages thereof, may best be understood by reference to the following description taken in connection with the accompanying illustrative drawings.

DETAILED DESCRIPTION OF THE PRESENTLY PREFERRED EMBODIMENTS

Figure 1:
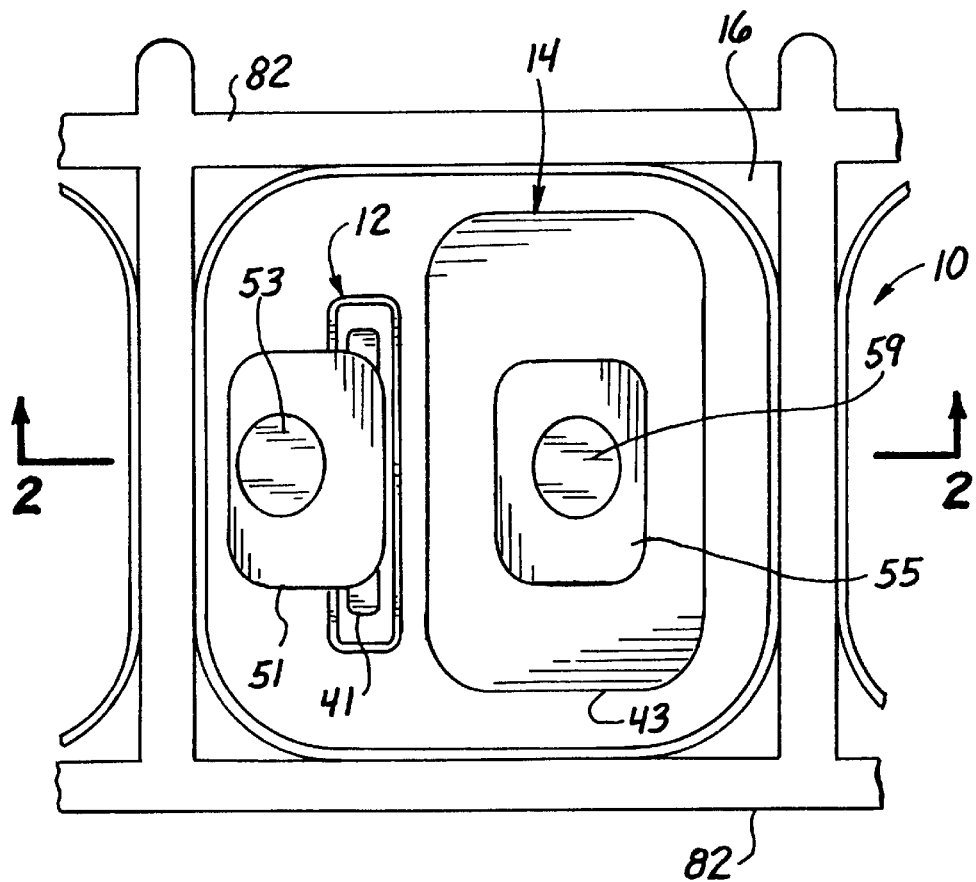
FIG. 1 illustrates a top planar view of a planar-lateral collector pixel in accordance with the presently preferred embodiment.

Referring more particularly to the drawings, FIG. 1 illustrates a top-planar view of a multi-spectral planar photodiode infrared radiation detector (MPP) pixel 10 in accordance with the presently preferred embodiment. The MPP pixel 10 comprises a first color infrared radiation planar photodiode 12 for detecting medium wavelength infrared radiation (MWIR) and a second color infrared planar photodiode 14 for detecting long wavelength infrared radiation (LWIR). A delineating trench 16 is formed around the first color infrared planar photodiode 12 and the color infrared planar photodiode 14 in the illustrated embodiment.

Figure 2:
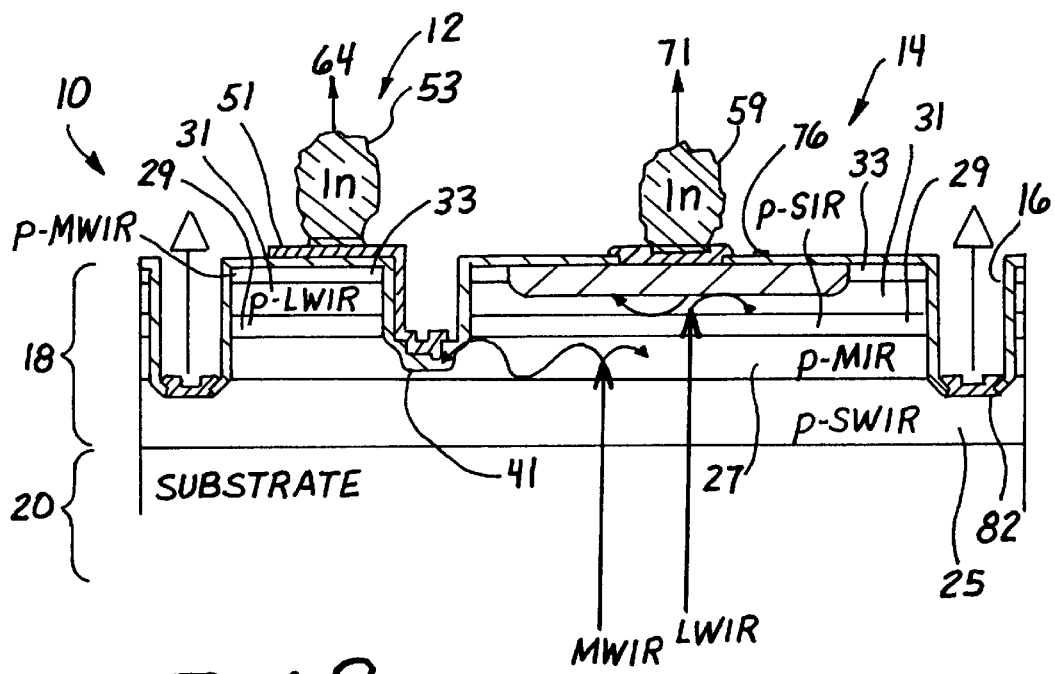
FIG. 2 illustrates a cross-sectional view, taken along the line 2—2 of FIG. 1.

A cross-sectional view of the MPP pixel 10, taken along the line 2—2 of FIG. 1, is illustrated in FIG. 2. The MPP pixel 10 generally comprises a multi-layered semiconductor structure 18 formed on a semiconductor substrate 20. In the presently preferred embodiment, the entire multi-layered semiconductor structure 18 is grown in a single-growth run using molecular beam epitaxy. A buffer layer 25 is first grown on the semiconductor substrate 20 and, subsequently, a first color layer 27 is grown on the buffer layer 25. A barrier layer 29, a second color layer 31 and a cap layer 33 are subsequently grown to form the multi-layered semiconductor structure 18. In accordance with the present invention, the buffer layer 25, the first layer 27, the barrier layer 29, the second color layer 31 and the cap layer 33 all comprise the same conductivity type. In the illustrated embodiment of FIG. 2, the layers 25, 27, 29, 31 and 33 all comprise a p conductivity type.

The buffer layer 25 is selected to have a band gap that is greater than the spectral regions of infrared radiation desired to be detected by the first color infrared color radiation detector 12 and the second color infrared radiation detector 14. As shown in FIG. 2, the buffer layer 25 is preferably engineered to comprise a wide band gap for absorbing short wavelength radiation (SWIR), as is the barrier layer 29. The first color layer 27 is engineered to absorb a medium wavelength infrared radiation (MWIR), and the second color layer 31 is engineered to absorb long wavelength infrared radiation (LWIR). In accordance with the present invention, the MWIR and LWIR can comprise virtually any combination of wavelength regions that are detectable by HgCdTe type devices, wherein the MWIR radiation wavelength is less than the LWIR radiation wavelength.

A first color diode 41 comprising an opposite conductivity type is induced into the first color layer 27, and a second color diode 43 comprising the same conductivity type as the first color diode 41 is induced into the second color layer 31 and the cap layer 33. In the present preferred embodiment the introduction method is ion implantation of arsenic dopant ions followed by Hg-vapor annealing to activate the dopant. A first contact pad 51 connects the first color diode 41 to a first idiom column 53, and a second contact pad 55 connects the second color diode 43 to a second idiom column 59. Incident MWIR radiation is absorbed within the first color layer 27, generating electron-hole pairs. The electrons are laterally collected by the first color diode 41, thereby generating a first color signal 64 corresponding to an amount of detected MWIR radiation. Similarly, LWIR radiation is detected by the second color diode 43, generating a second color signal 71.

Figure 3:
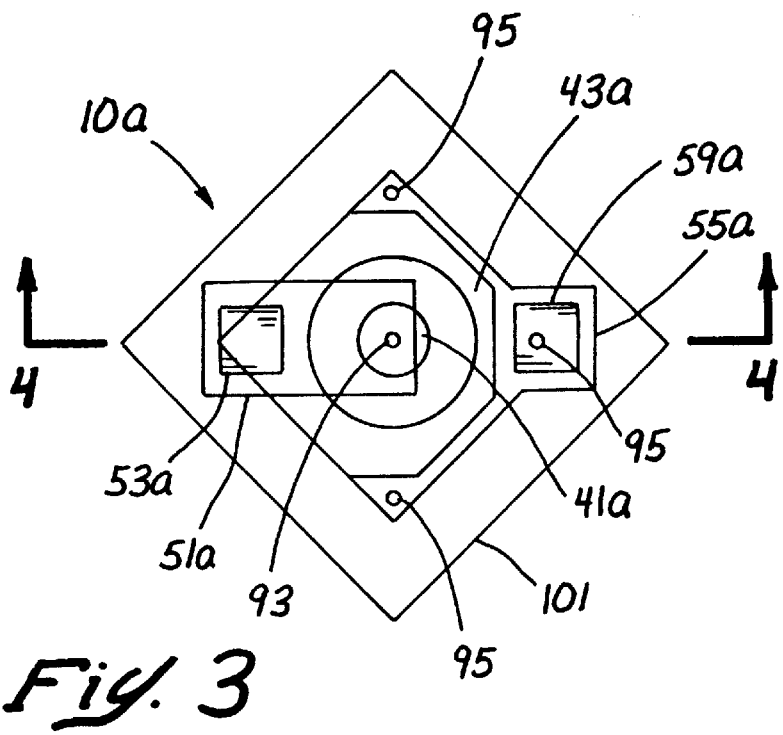
FIG. 3 illustrates a top-planar view of a planar-lateral collector pixel in accordance with another embodiment of the present invention.
Figure 4:
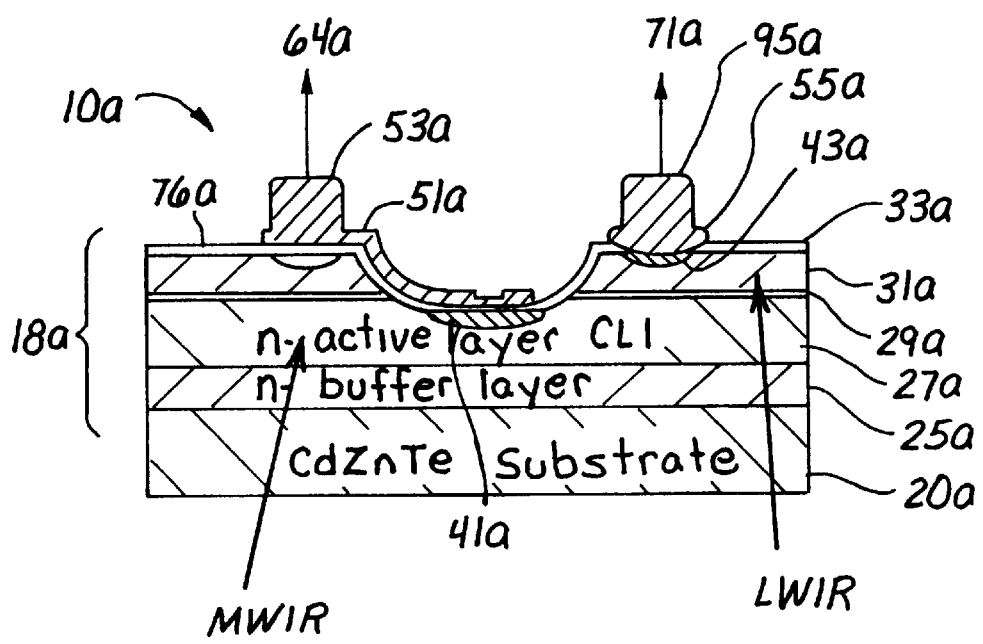
FIG. 4 illustrates a cross-sectional view, taken along the line 4—4 of FIG. 3.

In accordance with the present invention, the epitaxial growing of the buffer layer 25, the first color layer 27, the barrier layer 29, the second color layer 31 and the cap layer 33 in a single growth process, before any delineation procedures, provides a very efficient and accurate manufacturing process. After the generation of the multi-layered semiconductor structure 18, a photolithographically patterned etching process is used to create the depression through the cap layer 33, the second color layer 31, the barrier layer 29 and a portion of the first color layer 27, for subsequent induction of the first color diode 41. The second color diode 43 is also formed after the multi-layered semiconductor structure 18 is generated, as is the delineating trench 16 in the illustrated embodiment. In alternative embodiments utilizing p on n-type conductivity configurations, such as shown in FIGS. 3 and 4, for example, the delineating trench 16 may be omitted. The delineating trench 16 prevents carriers from diffusing out of the planar-lateral collector pixel 10, thereby minimizing cross-talk. In a modified embodiment, slight grading of composition or grading of doping can reduce trench depth requirements. In contrast to conventional simultaneous multi-color detectors, the delineating trench 16 does not cut through any junctions. Accordingly, any damage to the surface (usually n-type, for example,) occurs in a relatively benign region of the detector, minimizing adverse effects on device performance. A passivation layer 76 is deposited over the multi-spectral planar photodiode pixel 10, with the exception of contacts between the ground strip 82 and the buffer layer 25, between the first contact pad 51 and the first color diode 41 and between the second contact pad 55 and the second color diode 43.

FIGS. 3 and 4 illustrate an embodiment having an opposite conductivity type to the embodiment of FIGS. 1 and 2, wherein like elements are designated with like numerals followed by the letter "a." A planar-lateral collector pixel 10a comprises a first color diode 41a and a second color diode 43a, both of which are formed into a multi-layered semiconductor structure 18a (FIG. 4). The first contact pad 51a connects the first color diode 41a to the first idiom column 53a via a contact hole 93, and a second contact pad 55a connects the second color diode 43 to the second idiom column 59a via contact holes 95. As with the embodiment of FIGS. 1 and 2, the buffer layer 25a, the first color layer 27a, the barrier layer 29a, the second color layer 31a and the cap layer 33a are all preferably formed in a single growth run and, subsequently, the first color diode 41a and the second color diode 43a are deposited. In the illustrated embodiment, the semiconductor substrate 20a comprises a CdZnTe material substrate, and the buffer layer 25a and barrier layer 29a comprise HgCdTe compositions having relatively wide band gaps. As with the embodiment of FIGS. 1 and 2, the relatively wide band gap buffer and barrier layers 25a and 29a, and also the cap layer 33a, operate to confine minority carriers until they are captured by the appropriate junctions in the respective first and second color layers 27a and 31a. The lateral-collection second color diode 43a construction and composition in accordance with the present invention utilizes the relatively long diffusion length resulting from relatively long lifetimes of minority carriers, to thereby insure reasonable quantum efficiency of the first color diode 41 from primarily lateral collection. In the illustrated embodiment the first color layer 27a and the second layer color layer 31a comprise HgCdTe compositions for absorbing MWIR radiation and LWIR radiation, respectively.

The construction of the multi-layered semiconductor structure 18a is preferably accomplished using molecular beam epitaxy of HgCdTe and a straight forward extension of a double-layer planar heterostructure (DLPH) detector diode architecture, which is generally described in the following references, the contents of which are expressly incorporated herein by reference: J. M. Arias, J. G. Pasko, M. Zandian, S. H. Shin, G. M. Williams, L. O. Bubulac, R. E. DeWames, and W. E. Tennant, *Appl. Phys. Lett.* 62, 976 (1993); W. V. McLevige, D. D. Edwall, J. G. Pasko, L. O. Bubulac, J. T. Viola, W. E. Tennant, K. Vural, J. Ellsworth, H. Vydyanath, R. K. Purvis, S. E. Anderson, and R. A. Ramos, Proceedings of the IRIS Specialty Group on Infrared Detectors, Laurel, Md. (1995); and W. V. McLevige, D. D. Edwall, M. Zandian, J. G. Pasko, R. B. Bailey, M. M. Mahdav, J. T. Viola, W. E. Tennant, K. Vural, J. M. Arias, S. E. Anderson, R. A. Ramos, and M. E. Dunn, Proceedings of the IRIS Specialty Group on Infrared Detectors, Boulder, Colo. (1996). The materials growth and junction formation techniques generally incorporated into the structure of FIGS. 3 and 4, for example, are described in the following references, the contents of which are expressly incorporated herein by reference: J. M. Arias, "Growth of HgCdTe by molecular-beam epitaxy," in *Properties of Narrow Gap Cadmium-based Compounds*, EMIS Datareview Series No. 10, Inspec publication, edited by Peter Capper, 30–35 (1994); J. J. Arias, J. G. Pasko, M. Zandium, J. Bajaj, L. J. Kozlowski, R. E. DeWames and W. E. Tennant, *Proceedings* of SPIE Symposia on "Producibility of II–VI Materials and Devices," Volume 2228, 1994; J. Bajaj, J. M. Arias, M. Zandian, J. G. Pasko, L. J. Kozlowski, R. E. DeWames and W. E. Tennant, "Molecular Beam Epitaxial HgCdTe Materials Characteristics and Device Performance: Reproducibility Statistics," *J. Electronic Materials* 24, 1067 (1995); and J. Bajaj, M. Zandian, J. G. Pasko, L. O. Bubulac and J. M. Arias, "Advances in MBE HgCdTe Growth Technology at Rockwell," Proceedings f the 1995 IRIS Specialty Group on Infrared Materials, Laurel, Md. (1995).

The buffer layer 25a provides an ideally passive interface for the first color layer 27a. Deliberate grading and inter-diffusion during later activation anneal grades the interfaces between layers to about 0.5 microns in the illustrated embodiment. Light in the first spectral band (MWIR) is absorbed in the first color layer 27a to thereby generate first color signals 64a. A thickness of the first color layer 27a can be as large as necessary to minimize cross-talk from first color penetration into the second color layer 31a. Carriers generated in the first color layer 27a diffuse to nearby junctions, being constrained by the buffer layer 25a and the barrier layer 29a. Diffusion lengths of the HgCdTe which are typically about 30 microns are adequate to allow efficient collection from remote regions of 50 to 60 micron or smaller planar-lateral collector pixels 10a. Light in the second spectral band (LWIR) is absorbed within the second color layer 31a, to thereby generate a second color signal 71a. The cap layer 33a confines diffusion of second color generated carriers within the second color layer 31a until they are collected by a junction. In the illustrated embodiment, the second color layer 31a and the cap layer 33a can be the same as the baseline molecular beam epitaxy architecture used for the above-mentioned double-layer planar hetero structure detector diodes.

Although the etch through the cap layer 33a, the second color 31a, and typically through the barrier layer 29a, removes some of the active regions from the second color detectors, only the very bottom of the etched portion is optically inactive, since LWIR radiation reflects from the sides of the removed area to be collected by the LWIR junctions. In the illustrated embodiment, the thicknesses of the first color layers 27a and the second color layer 31a are approximately 8 microns and 5 microns, respectively. Thinner layers may be used if the band gap of the second color layer 31a is substantially smaller than the lowest energy infrared radiation to be detected. In embodiments where the first color layer 27a and the second color layer 31a are on the order of about 5 microns, for example, a single implant step is sufficient to form both the MWIR and the LWIR junctions. Junction activation anneal is very similar to that used for the above-mentioned double-layer planar hetero structure detector diodes. A passivation layer 76a, which is similar to that used in connection with the above-mentioned double-layer planar hetero structure detector diodes, comprising molecular beam epitaxy CdTe is preferred.

Over the edge metalization allows the indium columns 53a and 59a to be deposited on a common surface permitting standard hybrid fabrication. In one embodiment, the entire process for fabricating the planar-lateral collector pixel 10a differs from a conventional process only in the structure grown by molecular beam epitaxy, the etching and deposition of the first color diodes 41a, and the delineation trench 16 (FIG. 1) if used. In the embodiment of FIGS. 3 and 4, a delineation trench may be omitted, due to the fact that n-conductivity material is quite conductive and, accordingly, ground contacts can be constructed at a remote location well outside the perimeter 101 of the planar-lateral collector pixel 10a.

Figure 5:
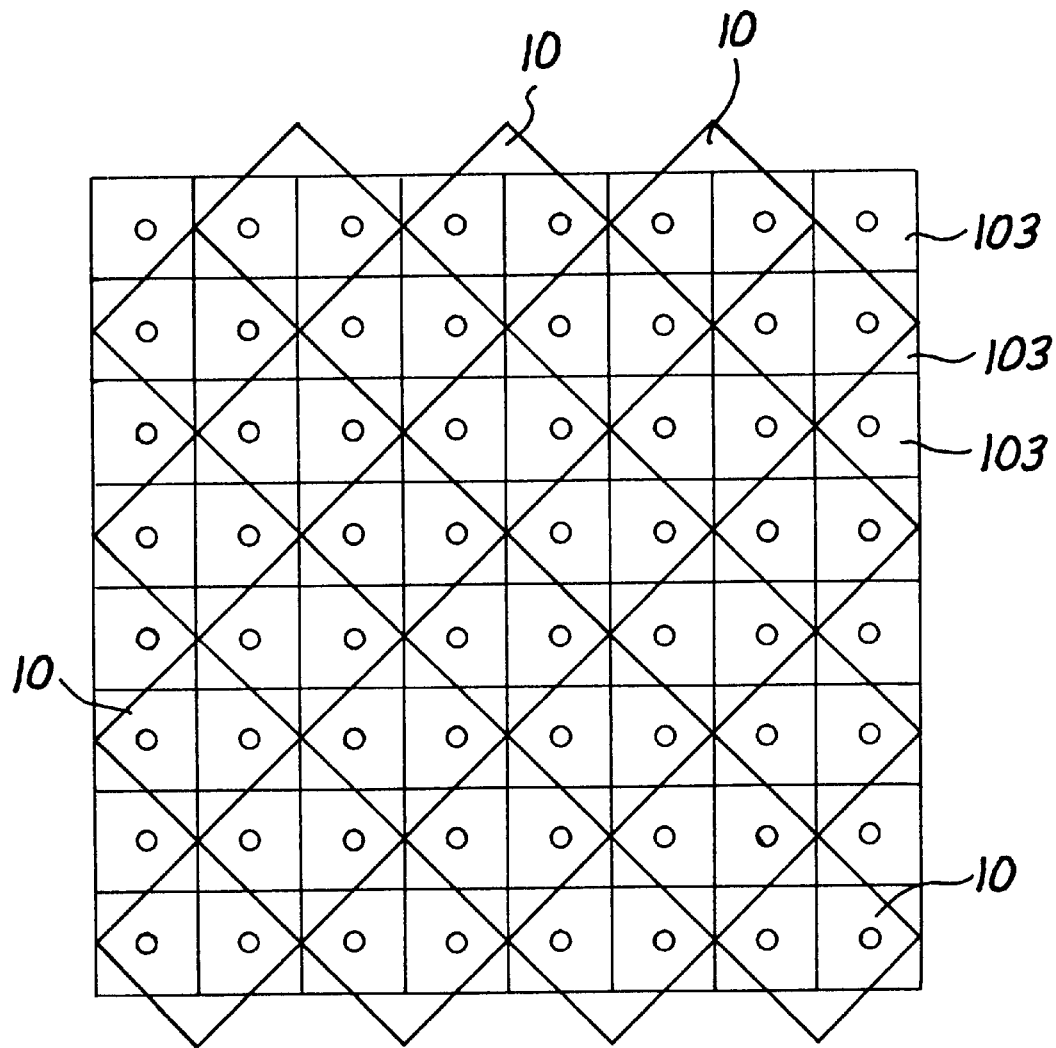
FIG. 5 illustrates an array of detector pixel elements connected to readout circuits in accordance with the present invention.

FIG. 5 illustrates a plurality of planar-lateral collector pixels 10 connected to readout circuits 103. In accordance with the present invention, the planar-lateral collector pixels 10 can be connected to a standard 128 by 128 single-color multiplexer for conveniently effectuating a multi-spectral simultaneous infrared radiation detector device. Specifics relating to this interconnection and numerical testing and analysis of the planar-lateral collector pixel 10 is generally described in the following reference: W. E. Tennant, L. J. Kozlowski, W. V. McLevige, D. D. Edwall and C. Cabelli, "Multi-spectral Simultaneous HgCdTe Infrared Focal Plane Arrays with Single-Color Performance," Proceedings of the IRIS Detector Specialty Group, Monterey, Calif. (1997), the contents of which are expressly incorporated herein by reference.

The planar-lateral collector pixels of the present invention provide sensitivity comparable to that of single color detectors, simultaneous detection in all bands of interest, broadband sensitivity within each band, low electrical and optical cross talk between pixels or colors, high optical fill factor, compatibility with conventional readout circuits, and minor impact processing. The above embodiments have been described in connection with two-color detectors, but additional color detectors (3 or more colors) may be implemented. Additional layers with additional color detecting diodes can be stacked one upon another in accordance with the present invention, limited only by the sophistication of the photolithography and multiplexer capability. Variations of the described basic lateral collection structure and other implementations thereof may be constructed for varying applications. In accordance with another aspect of the present invention, virtually all of the incident infrared radiation within a pixel can be collected efficiently using microlenses, in which case a delineating trench is unnecessary and vary small pixel geometries can be constructed.

Although an exemplary embodiment of the invention has been shown and described, many other changes, modifications and substitutions, in addition to those set forth in the above paragraphs, may be made by one having ordinary skill in the art without necessarily departing from the spirit and scope of this invention.

An additional embodiment is worth mentioning since it allows for larger first color diode area and thus is suited to larger pixels. In this embodiment, the multi-layer structure is grown as for the devices shown in FIGS. 2 and 4 except the last portion of the first color layer and preferably the first portion of the barrier layer are grown with the opposite polarity from the common polarity type grown in the rest of the structure. This portion of the grown structure with opposite polarity type is preferably sufficiently thin (for example on the order of 1 $\mu$m) that certain regions of it may be converted throughout their thickness in the direction normal to the layers to the common polarity type by local introduction of an appropriate dopant by patterned implantation or diffusion. For this embodiment the depression is etched as before into or through the barrier layer but not so deep into the first color layer as to remove all the opposite polarity-material from the bottom of the depression. For this embodiment the trench etch around the pixel perimeter must be used with the trench extending into, but preferably not through, the opposite polarity material from the cap and first color layers. The opposite polarity diodes in the first color layers are delineated by converting their perimeters to the common polarity type. This is done by introducing a dopant into the material forming the trench, including into the sides of the trench near its bottom (wherever the sides have opposite polarity type due to the trench having been etched partially through the opposite polarity region) as well as into the trench bottom itself. This dopant, after being activated by annealing as needed, converts the opposite polarity region in the vicinity of the trench bottom to the common polarity by counter doping. Ion implantation of an appropriate species (boron for n-type and arsenic for p-type are examples) followed by an activation anneal in the trench is the preferred embodiment for this counter doping; however, diffusion of an appropriate dopant (from any of a variety of potential sources known to those experienced in the art, including implantation, evaporated films, spin-on sources, etc.) could also be effective. Because the dopant serves to reestablish the common polarity type only around the diode perimeter, the first color diode now covers almost the full area of the pixel and requires no significant lateral collection for efficient detection of first color radiation.

We claim:

1. A radiation detector for detecting electromagnetic radiation at a plurality of spectral bands, comprising:

a multi-layered semiconductor structure comprising a plurality of layers, wherein each of the layers of the multi-layered semiconductor structure comprises a first conductivity type;

a first planar diode deposited in a first color layer of the multi-layered semiconductor structure, the first planar diode intersecting only a portion of a planar surface area of the first color layer, the first color layer having a first band gap and the first planar diode having a second conductivity type; and an additional planar diode deposited in an additional color layer of the multi-layered semiconductor structure, the additional color layer having an additional band gap and the additional planar diode having the second conductivity type, the first band gap being greater than the second band gap and the additional planar diode intersecting only a portion of a planar surface area of the additional color layer.

2. The radiation detector as set forth in claim 1, wherein the multi-layered semiconductor structure comprises a 5 layer epitaxial structure which is grown by molecular beam epitaxy.

3. The radiation detector as set forth in claim 2, wherein the multi-layered semiconductor structure comprises a multi-layered p-type semiconductor structure.

4. The radiation detector as set forth in claim 2, and further including a delineating trench formed around the two planar diodes.

5. The radiation detector as set forth in claim 4, wherein:

the delineating trench is etched into the five layers; and a conductor is formed within the delineating trench.

6. The radiation detector as set forth in claim 1, wherein the multi-layered semiconductor structure comprises a multi-layered n-type semiconductor structure.

7. The radiation detector as set forth in claim 6, wherein the multi-layered n-type semiconductor structure comprises a 5 layer epitaxial structure which is grown by molecular beam epitaxy.

8. The multi-color pixel as set forth in claim 1, wherein The multi-layered semiconductor structure is generated by growing the layers of the multi-layered semiconductor structure in a single growth run.

9. The radiation detector as set forth in claim 1, and further comprising:

at least one other planar diode deposited in at least one other color layer of the multi-layered semiconductor structure, the at least one other color layer having at least one other band gap and the at least one other planar diode having the second conductivity type, the first band gap being greater than the second band gap and the at least one other planar diode intersecting only a portion of a planar surface area of the at least one other color layer.

10. A multi-color pixel comprising:

a semiconductor substrate layer;

a buffer layer of a first conductivity type material deposited on the semiconductor substrate layer;

a first color layer of the first conductivity type material deposited on the buffer layer;

a barrier layer of the first conductivity type material deposited on the first color layer;

a second color layer of a first conductivity type material deposited on the barrier layer; and a cap layer of a first conductivity type material deposited on the second color layer;

wherein a first planar diode comprising a second conductivity type material is formed in a portion of a planar surface area of first color layer; and wherein a second planar diode comprising a second conductivity type material is formed in a portion of a planar surface area of the second color layer.

11. The multi-color pixel as set forth in claim 10, wherein the first buffer layer, the first color layer, the barrier layer, the second color layer, and the cap layer are deposited on the semiconductor substrate in a single growth run.

12. The multi-color pixel as set forth in claim 10, and further including a delineating trench formed around the first and second planar diodes.

13. The multi-color pixel as set forth in claim 12, wherein a conductor is formed within the delineating trench.

14. The multi-color pixel as set forth in claim 10, wherein the first-conductivity type material comprises a p-type material.

15. The multi-color pixel as set forth in claim 14, wherein
the semiconductor substrate comprises a CdZnTe semiconductor substrate;

the first color layer comprises a HgCdTe semiconductor structure having a first band gap; and the second color comprises a HgCdTe semiconductor structure having a second band gap.

16. The multi-color pixel as set forth in claim 15, wherein the first band gap is greater than the second band gap.

17. The multi-color pixel as set forth in claim 10, wherein the first-conductivity type material comprises an n-type material.

18. The multi-color pixel as set forth in claim 17, wherein
the semiconductor substrate comprises a CdZnTe semiconductor substrate;

the first color layer comprises a HgCdTe semiconductor structure having a first band gap; and the second color layer comprises a HgCdTe semiconductor structure having a second band gap.

19. The multi-color pixel as set forth in claim 18, wherein the first band gap is greater than the second band gap.

* * * * *